(12) United States Patent
Takezono

(10) Patent No.: US 12,470,181 B2
(45) Date of Patent: Nov. 11, 2025

(54) POWER AMPLIFIER CIRCUIT

(71) Applicant: Murata Manufacturing Co., Ltd., Kyoto (JP)

(72) Inventor: Naofumi Takezono, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 637 days.

(21) Appl. No.: 17/812,215

(22) Filed: Jul. 13, 2022

(65) Prior Publication Data

US 2023/0013008 A1    Jan. 19, 2023

(30) Foreign Application Priority Data

Jul. 16, 2021   (JP) ................................ 2021-117598

(51) Int. Cl.
*H03F 3/21* (2006.01)
*H03F 1/56* (2006.01)

(52) U.S. Cl.
CPC ............... *H03F 3/21* (2013.01); *H03F 1/565* (2013.01); *H03F 2200/387* (2013.01)

(58) Field of Classification Search
CPC ...... H03F 3/21; H03F 1/565; H03F 2200/387; H03F 3/245

USPC ........................................................ 330/149
See application file for complete search history.

(56) References Cited

U.S. PATENT DOCUMENTS

| | | | |
|---|---|---|---|
| 2018/0062590 A1 | 3/2018 | Ishihara et al. | |
| 2019/0222199 A1* | 7/2019 | Nosaka | H03H 9/64 |
| 2021/0359649 A1* | 11/2021 | Honda | H03F 3/211 |
| 2023/0053456 A1* | 2/2023 | Hase | H03H 7/075 |

FOREIGN PATENT DOCUMENTS

JP    2018-032951 A    3/2018

* cited by examiner

*Primary Examiner* — Andrea Lindgren Baltzell
*Assistant Examiner* — Jose E Pinero
(74) *Attorney, Agent, or Firm* — McDonald Hopkins LLC

(57) ABSTRACT

A power amplifier circuit includes: an amplifier that amplifies an input signal; and a resonant circuit that is connected to an output terminal of the amplifier and that attenuates a harmonic wave of an amplified signal obtained by amplifying the input signal. The resonant circuit includes an inductor disposed between the amplifier and a ground, a capacitive element disposed between the amplifier and the ground and connected in series to the inductor, an inductor connected in parallel to the inductor, a switch connected in series to the inductor, and a switch that is connected in parallel to the switch and that is of an element size common to an element size of the switch.

7 Claims, 4 Drawing Sheets

POWER AMPLIFIER CIRCUIT

CROSS REFERENCE TO RELATED APPLICATION

This application claims priority from Japanese Patent Application No. 2021-117598 filed on Jul. 16, 2021. The content of this application is incorporated herein by reference in its entirety.

BACKGROUND ART

The present disclosure relates to a power amplifier circuit.

In mobile communications using a cellular phone and other apparatuses, power amplifier circuits are used to amplify power for transmission signals. In such a power amplifier circuit, a resonant circuit (harmonic termination circuit) is used to attenuate a harmonic wave of an amplified signal output from an amplifier. Japanese Unexamined Patent Application Publication No. 2018-32951 discloses a power amplifier module that mitigates the deterioration of the characteristics of a harmonic termination circuit even if variations are present from element to element. To mitigate the deterioration, a control circuit controls the capacitance value of parasitic capacitance of each of field effect transistors (FETs) in the harmonic termination circuit.

BRIEF SUMMARY

As described in Japanese Unexamined Patent Application Publication No. 2018-32951, varying the sizes of elements as the FETs in the harmonic termination circuit causes the FETs to have different on-resistance values. For example, if the FETs include a FET of a small element size, the FET has a high on-resistance value.

Suppose a case where such a harmonic termination circuit is provided in a power amplifier circuit supporting multiple bands, not in the power amplifier circuit that finely corrects the resonant frequency as described in Japanese Unexamined Patent Application Publication No. 2018-32951. If a FET used for switching between the resonant frequencies has a high on-resistance value, the Q value of the resonant circuit is lowered. The lowering of the Q value leads to attenuation of waves other than the harmonic wave intended to be attenuated by the resonant circuit. This increases an insertion loss of a signal in the power amplifier circuit.

The present disclosure has been made under these circumstances and aims to provide a power amplifier circuit enabled to reduce an insertion loss and amplify signals in multiple frequency bands.

A power amplifier circuit according to an aspect of the present disclosure includes an amplifier and a resonant circuit. The amplifier amplifies an input signal and outputs an amplified signal. The resonant circuit is connected to an output terminal of the amplifier and attenuates a harmonic wave of the amplified signal. The resonant circuit includes a first inductance element disposed between the amplifier and a ground, a capacitive element disposed between the amplifier and the ground and connected in series to the first inductance element, a second inductance element connected in parallel to the first inductance element, and a second switch of an element size common to an element size of a first switch.

The present disclosure may provide a power amplifier circuit enabled to reduce an insertion loss and amplify signals in multiple frequency bands.

DETAILED DESCRIPTION

Figure 1:
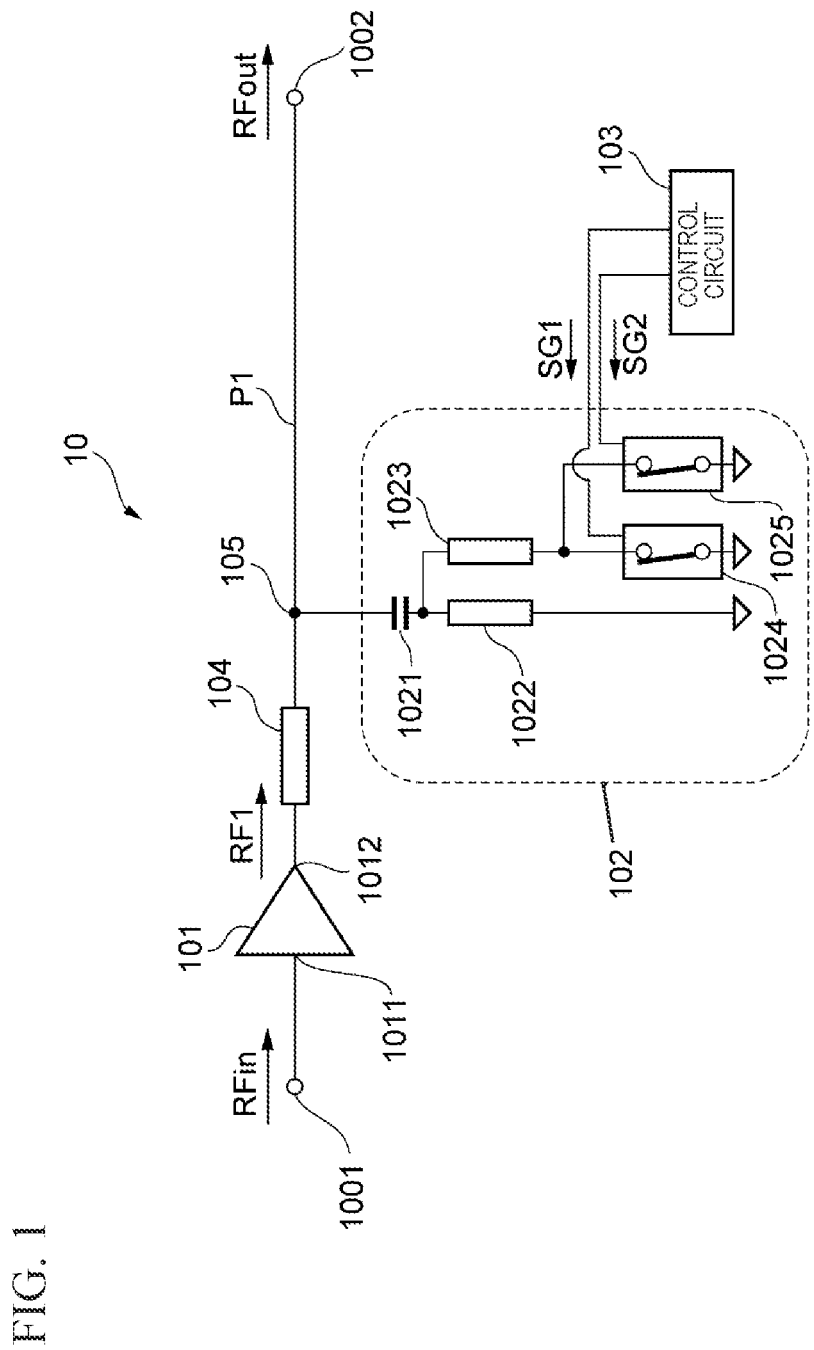
FIG. 1 is a circuit diagram of a power amplifier circuit according to a first embodiment.

A first embodiment will be described. FIG. 1 is a circuit diagram of a power amplifier circuit 10 according to the first embodiment. The power amplifier circuit 10 includes an amplifier 101, a resonant circuit 102, and a control circuit 103, and an inductor 104.

The power amplifier circuit 10 amplifies power in the following manner. An input signal RFin input from an input terminal 1001 is amplified by using the amplifier 101, and an output signal RFout is output from an output terminal 1002.

The amplifier 101 includes an input terminal 1011 and an output terminal 1012. The input terminal 1011 is connected to the input terminal 1001. The output terminal 1012 is connected to the inductor 104 and the resonant circuit 102 with a signal path P1 (first signal path) interposed therebetween.

The amplifier 101 amplifies power by using, for example, a bipolar transistor such as a heterojunction bipolar transistor (HBT) or a field effect transistor such as a metal-oxide-semiconductor field-effect transistor (MOSFET).

The amplifier 101 outputs, from the output terminal 1012, an amplified signal RF1 obtained by amplifying the input signal RFin.

The resonant circuit 102 is disposed between the signal path P1 and a ground. The resonant circuit 102 is connected to the signal path P1 at a connecting point 105. The resonant circuit 102 adjusts impedance observed in a direction from the output terminal 1012 to the output terminal 1002 and thereby prevents a harmonic wave of the amplified signal RF1 from propagating to the output terminal 1002. Hereinafter, adjusting the impedance and thereby preventing a harmonic wave from propagating to the output terminal 1002 is also referred to as terminating. The resonant circuit 102 terminates, for example, a second-order harmonic wave with a frequency of a fundamental wave of the amplified signal RF1 (fundamental frequency).

The resonant circuit 102 includes a capacitive element 1021 (first capacitive element), an inductor 1022 (first inductance element), an inductor 1023 (second inductance element), and switches 1024 and 1025. One end of the capacitive element 1021 is connected to the connecting point 105, and the other end thereof is connected to one end of the inductor 1023 and one end of the inductor 1022. The other end of the inductor 1022 is connected to the ground.

The switch 1024 (a first switch) and the switch 1025 (a second switch) are switches connected in parallel to each other. Each of the switches 1024 and 1025 is each connected to the inductor 1023 at the input end of a corresponding one of the switches 1024 and 1025 and is connected to the ground at the output end thereof.

The switches 1024 and 1025 are of a common element size. The element size of each of the switches 1024 and 1025 is measured as a surface area of a corresponding one of the switches 1024 and 1025. The switches 1024 and 1025 are of the common element size and thus have a common on-resistance value at the time when the switches 1024 and 1025 are turned on. Note that the case "common element size" includes not only a case where the element sizes are completely identical but also a case where the elements have variations of plus or minus 15% in the element size.

The switches 1024 and 1025 each performs switching between the on state and the off state based on control signals SG1 and SG2 (described later) from the control circuit 103.

The switches 1024 and 1025 are, for example, MOSFETs, and respective gate voltages based on the control signals SG1 and SG2 are supplied to the respective gates to control the operation thereof. If the switches 1024 and 1025 are MOSFETs, the term "common on-resistance value" denotes that the on-resistance values each calculated based on power consumed by the corresponding MOSFET and a drain current value at the time when a predetermined gate-source voltage is applied to the switches 1024 and 1025 are common. Note that the case "common on-resistance value" includes not only a case where the on-resistance values are completely identical but also a case where the elements have variations of plus or minus 15% in the on-resistance value.

The resonant circuit 102 includes the capacitive element 1021 and the inductors 1022 and 1023 connected in series to the capacitive element 1021 and is an LC series resonant circuit controlled to resonate at the frequency of the second-order harmonic wave of the amplified signal RF1. When the resonant circuit 102 resonates at the frequency of the second-order harmonic wave, the second-order harmonic wave is thereby short-circuited. That is, the impedance of the second-order harmonic wave takes on a value close to zero at the connecting point 105.

The control circuit 103 is connected to the switches 1024 and 1025. The control circuit 103 supplies the control signal SG1 and the control signal SG2 to the switch 1024 and the switch 1025, respectively. The control circuit 103 supplies the control signals SG1 and SG2 for switching between a state (first state) in which both the switches 1024 and 1025 are turned on and a state (second state) in which both the switches 1024 and 1025 are turned off.

The inductor 104 is disposed between the output terminal 1012 of the amplifier 101 and the connecting point 105. The inductor 104 and the resonant circuit 102 function as a matching circuit that performs impedance matching between the output terminal 1012 of the amplifier 101 and the output terminal 1002.

In the power amplifier circuit 10, switching is performed between the on state and the off state of the switches 1024 and 1025, depending on the frequency of the input signal RFin, that is, between the first state and the second state.

In the first state, the resonant circuit 102 has an inductance value corresponding to a synthetic inductance value based on the respective inductance values of the inductors 1022 and 1023. In the second state, the inductor 1022 has an inductance value corresponding to the inductance value of the resonant circuit 102.

For example, if the frequency of the input signal RFin is relatively low, control is required such that the resonant circuit 102 has a relatively high inductance value. In this case, the control circuit 103 outputs the control signals SG1 and SG2 to turn off both the switches 1024 and 1025. In contrast, if the frequency of the input signal RFin is relatively high, control is required such that the resonant circuit 102 has a relatively low inductance value. In this case, the control circuit 103 outputs the control signals SG1 and SG2 to turn on both the switches 1024 and 1025.

In a case where the synthetic inductance value of the inductance values of the inductors 1022 and 1023 serves as the inductance value of the resonant circuit 102 in the power amplifier circuit 10, both the switches 1024 and 1025 are turned on. Turning on the two switches simultaneously causes a lower resistance value between the inductor 1023 and a ground than a resistance value in the case where one of the switches 1024 and 1025 is turned on. The lower the resistance value of the resonant circuit, the higher the Q value of the series resonant circuit. The Q value of the resonant circuit 102 is thus higher than the Q value in the case where one of the switches is turned on. Raising the Q value enables reduction of attenuation of waves other than the second-order harmonic wave intended to be attenuated by the resonant circuit 102. An insertion loss of a signal in the power amplifier circuit may thus be reduced.

Further, the switches 1024 and 1025 have the common on-resistance value. Suppose a case where one of two switches connected in parallel to each other has an on-resistance value common to the on-resistance value of the switches 1024 and 1025, and the other is of a smaller element size and has a higher on-resistance value. When control is performed to simultaneously turn on or off the two switches as described above, the on-resistance value in the case where the two switches are simultaneously turned on is higher than that in the case where the switches 1024 and 1025 take on the common on-resistance value. The use of the common on-resistance value for the switches 1024 and 1025 in the power amplifier circuit 10 enables more suppression of the on-resistance value.

In the power amplifier circuit 10, the switches 1024 and 1025 are disposed between the inductor 1023 and the ground but may be disposed between the capacitive element 1021 and the inductor 1023.

A second embodiment will be described. Description common to the first embodiment is omitted in the second embodiment and subsequent embodiments, and only different points are described. The same effect of the same configuration is not particularly referred to in each embodiment.

Figure 2:
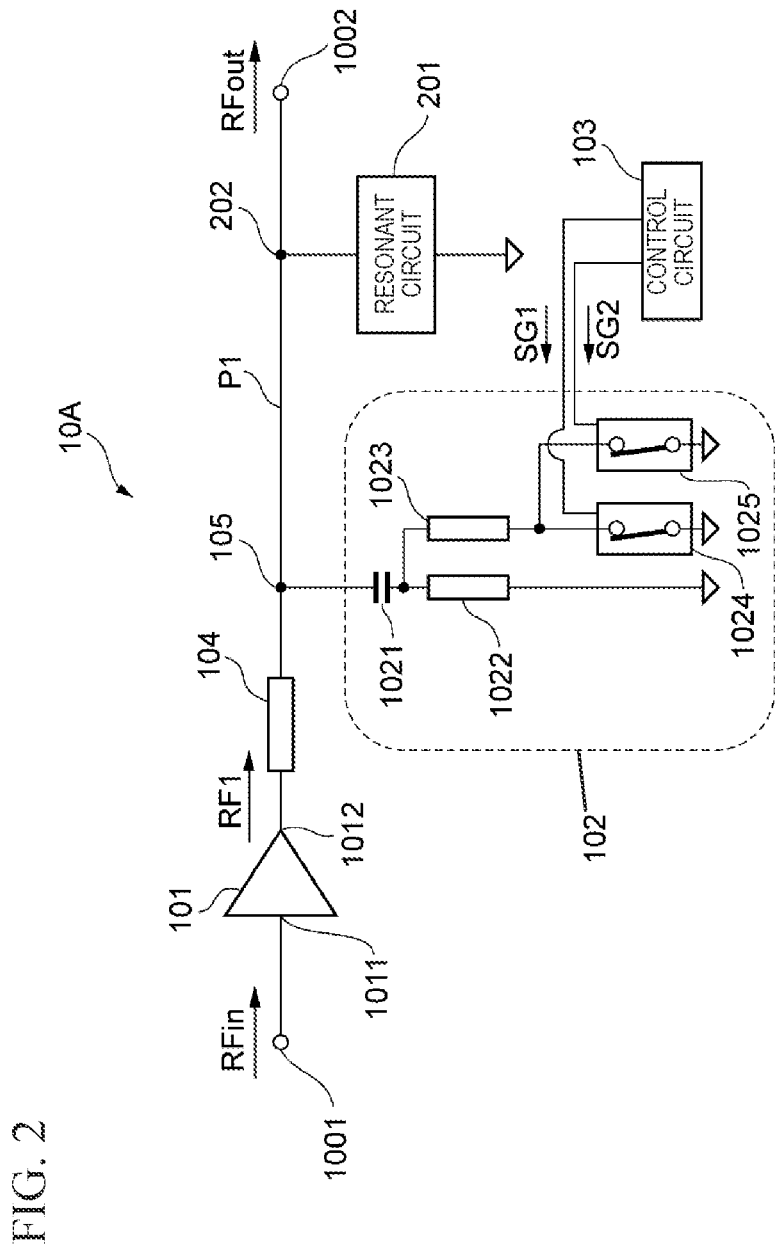
FIG. 2 is a circuit diagram of a power amplifier circuit according to a second embodiment.

FIG. 2 is a circuit diagram of a power amplifier circuit 10A according to the second embodiment. The power amplifier circuit 10A is different from the power amplifier circuit 10 in that a resonant circuit 201 is disposed between the signal path P1 and a ground.

The resonant circuit 201 (a second resonant circuit) is connected to the signal path P1 at a connecting point 202 closer to the output terminal 1002 than the connecting point 105 of the resonant circuit 102 (a first resonant circuit) is. The resonant circuit 201 is a circuit to terminate a harmonic wave different from a harmonic wave terminated by the resonant circuit 102. A different resonant circuit may be provided on the signal path P1 closer to the output terminal 1002 than the resonant circuit 201 is, but this is not illustrated in FIG. 2.

In the power amplifier circuit 10A, the resonant circuit 102 is connected to the output terminal 1012 of the amplifier 101 at a position electrically closer to the amplifier 101 than a position at which the resonant circuit 201 is connected to the amplifier 101. The impedance observed in a direction from the connecting point 105 to the output terminal 1002 takes on a lower value than the value of the impedance observed in a direction from the connecting point 202 to the output terminal 1002. The resonant circuit 102 thus performs impedance adjustment of the lower impedance value. Suppose a case where the resonant circuit 102 reduces the on-resistance value by a certain amount. In this case, the lower an impedance value for the adjustment is, the more a reduced amount of the on-resistance value contributes to the impedance adjustment. In the power amplifier circuit 10A, the resonant circuit 102 may thereby make the Q value higher than the resonant circuit 102 does in a case where a different resonant circuit is disposed between the amplifier 101 and the resonant circuit 102. An insertion loss is thus reduced more.

Figure 3:
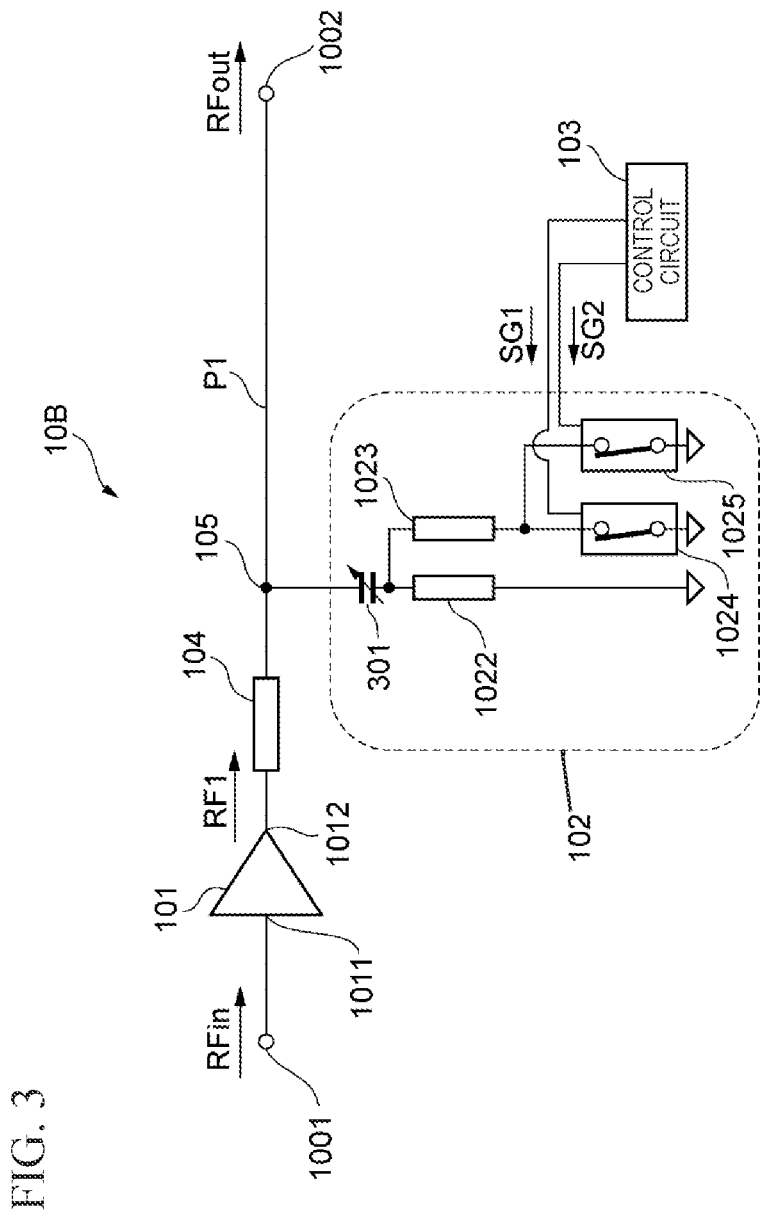
FIG. 3 is a circuit diagram of a power amplifier circuit according a third embodiment.

A third embodiment will be described. FIG. 3 is a circuit diagram of a power amplifier circuit 10B according to the third embodiment. The power amplifier circuit 10B is different from the power amplifier circuit 10 in that a variable capacitive element 301 replaces the capacitive element 1021 of the resonant circuit 102.

The variable capacitive element 301 is a digitally tunable capacitor (DTC) a capacitance value of which is controlled. The DTC has a capacitance value switched depending on a supplied control signal. In this embodiment, the capacitance value of the variable capacitive element 301 is controlled based on the frequency of the input signal RFin. For example, if the frequency of the input signal RFin is relatively low, control is performed to have a relatively high capacitance value of the variable capacitive element 301. If the frequency of the input signal RFin is relatively high, control is performed to have a relatively low capacitance value of the variable capacitive element 301. A varicap diode may also be used for the variable capacitive element 301.

In the power amplifier circuit 10B, the variable capacitive element 301 is provided in a resonant circuit 102B, and thereby adjustment in wider band resonant frequencies may be performed.

Figure 4:
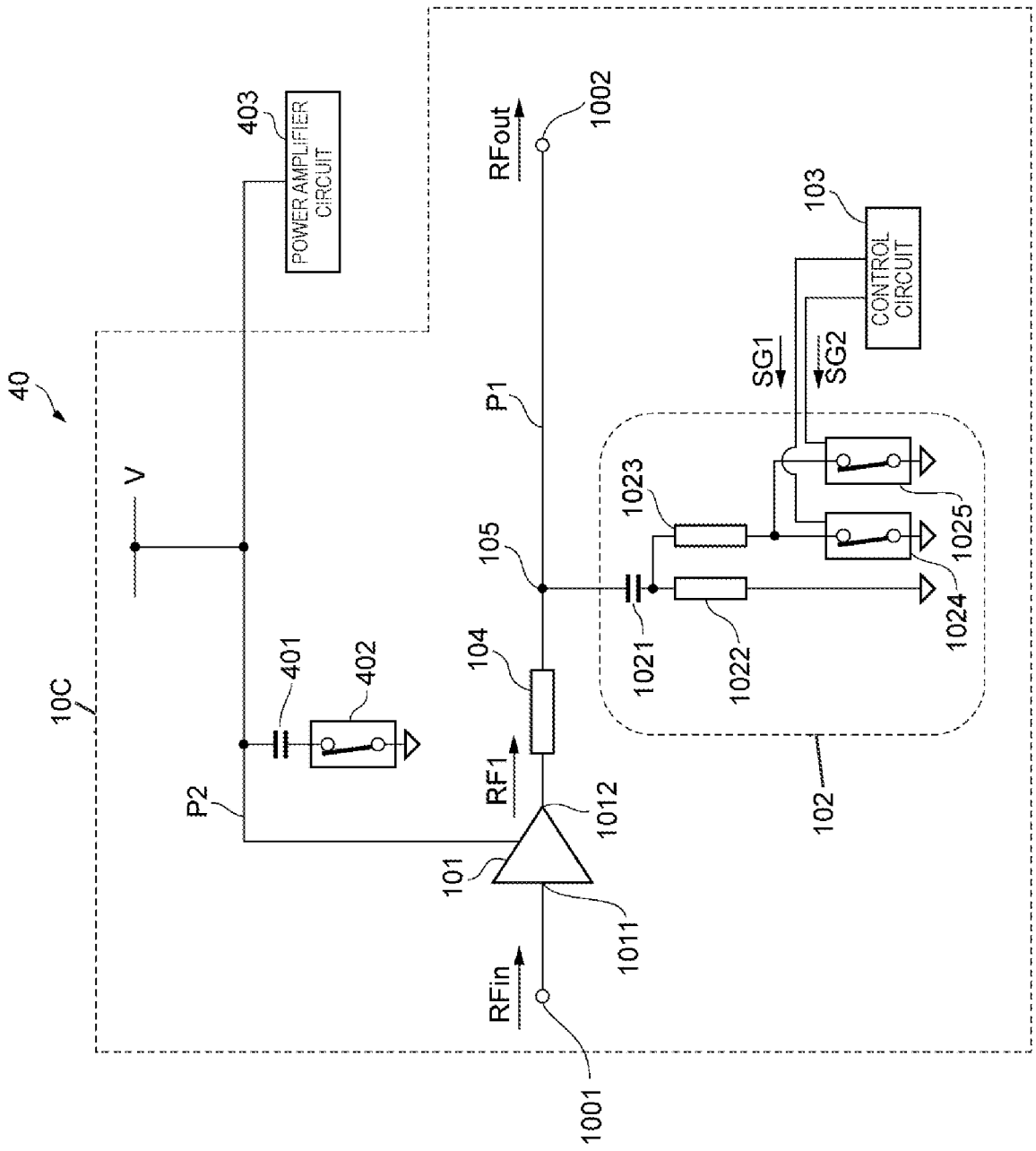
FIG. 4 is a circuit diagram of a power amplifier circuit according a fourth embodiment.

A fourth embodiment will be described. FIG. 4 is a circuit diagram of a power amplification device 40 including a power amplifier circuit 10C according to the fourth embodiment.

In the power amplifier circuit 10C, a power supply voltage V is supplied to the amplifier 101 through a signal path P2 (second signal path). The power amplifier circuit 10C includes a capacitive element 401 (second capacitive element) connecting the signal path P2 and a ground and a switch 402 (third switch). The switch 402 is formed on the substrate shared with the switches 1024 and 1025. The switch 402 is controlled by a control circuit (not illustrated) to be turned on when the amplifier 101 amplifies the input signal RFin and turned off when the amplifier 101 does not amplify the input signal RFin.

The power amplification device 40 includes the power amplifier circuit 10C and a power amplifier circuit 403 and is a device that amplifies a signal in such a manner as to perform switching between power amplifier circuits to be used for the amplification in accordance with an intended power amplification method. The power amplifier circuit 403 is, for example, a power amplifier circuit in which envelop tracking control is performed.

In the switching between the power amplifier circuits receiving the common power supply voltage as in the power amplification device 40, the capacitive element 401 can be not connected to the ground when the power amplifier circuit 403 operates. The switch 402 is thus turned on only when the amplifier 101 amplifies the input signal RFin. As described above, forming the switch 402 on the substrate shared with the switches 1024 and 1025 eliminates the need to separately providing a switch outside the power amplifier circuit 10C for connection switching by the capacitive element 401. The power amplification device 40 including the power amplifier circuit 10C may thus be downsized.

The exemplary embodiments of the present disclosure have heretofore been described. The power amplifier circuit 10 includes the amplifier 101 and the resonant circuit 102. The amplifier 101 amplifies the input signal RFin. The resonant circuit 102 is connected to the output terminal 1012 of the amplifier 101 and attenuates a harmonic wave of the amplified signal RF1 obtained by amplifying the input signal RFin. The resonant circuit 102 includes the inductor 1022 disposed between the amplifier 101 and the ground, the capacitive element 1021 connected in series to the inductor 1022, the inductor 1023 connected in parallel to the inductor 1022, the switch 1024 connected in series to the inductor 1023, and the switch 1025 that is connected in parallel to the switch 1024 and that is of the element size common to the element size of the switch 1024.

In the power amplifier circuit 10, the use of the common on-resistance value of the switches 1024 and 1025 enables the on-resistance value to be suppressed when the switches 1024 and 1025 are turned on as compared with the case where one of the switches is turned on. This enables the Q value of the resonant circuit 102 to be raised, and the insertion loss is reduced in the power amplifier circuit 10. In the power amplifier circuit 10, switching between the on state and the off state of the switches 1024 and 1025 is performed, depending on the frequency of the input signal RFin, and thereby switching between the resonant frequencies of the resonant circuit 102 is performed. The harmonic wave may thus be appropriately attenuated, and power may also be amplified. The power amplifier circuit 10 is a circuit enabled to reduce the insertion loss and amplify signals in multiple frequency bands.

The power amplifier circuit 10 further includes the control circuit 103 that supplies the switches 1024 and 1025 with the control signal for switching between the first state in which the switches 1024 and 1025 are turned on and the second state in which the switches 1024 and 1025 are turned off. The power amplifier circuit 10 may thereby perform the switching between the state in which the switches 1024 and 1025 are simultaneously turned on and the state in which the switches 1024 and 1025 are simultaneously turned off.

In the power amplifier circuit 10, the switches 1024 and 1025 are disposed between the inductor 1023 and the ground. If the switches 1024 and 1025 are each a MOSFET, the ground of the MOSFET and the drain of the MOSFET may be subjected to grounding connection. If the MOSFETs serving as the switches 1024 and 1025 are disposed between the inductor 1023 and the capacitive element 1021, the ground of each MOSFET and the drain of the MOSFET need to be subjected to the grounding connection and connection to the inductor 1023, respectively. As compared with this case, the power amplifier circuit 10 may have a reduced number of connection targets, and thus complicated circuit connection may be avoided.

The power amplifier circuit 10A further includes the resonant circuit 201 that is connected to the output terminal 1012 of the amplifier 101 and that attenuates the harmonic wave of the amplified signal RF1. The resonant circuit 102 is connected to the output terminal 1012 at a position electrically closer to the amplifier 101 than a position at which the resonant circuit 201 is connected to the amplifier 101.

The resonant circuit 102 thus performs impedance adjustment of an impedance value lower than an impedance value to which the resonant circuit 102 does in the case where a different resonant circuit is provided between the amplifier 101 and the resonant circuit 102. Suppose the case where the resonant circuit 102 reduces the on-resistance value by a certain amount. In this case, the lower an impedance value is, the more a reduced amount of the on-resistance value contributes to the impedance adjustment. In the power amplifier circuit 10A, the resonant circuit 102 may thereby raise the Q value, thus leading to more reduction of an insertion loss.

The power amplifier circuit 10B also includes the variable capacitive element 301 having a variable capacitance value. The power amplifier circuit 10B may thereby perform adjustment in wider band resonant frequencies and reduce an insertion loss.

The power amplifier circuit 10C includes the signal path P1, the signal path P2, the capacitive element 401, and the switch 402. The signal path P1 connects the output terminal 1012 of the amplifier 101 and the resonant circuit 102. The amplifier 101 receives power supply through the signal path P2. The capacitive element 401 is disposed between the signal path P2 and the ground. The switch 402 is connected to the capacitive element 401. The switch 402 is turned on when the amplifier 101 amplifies the input signal RFin and is turned off when the amplifier 101 does not amplify the input signal RFin. The switches 1024, 1025, and 402 are formed on the shared substrate.

This eliminates the need to separately provide a switch outside the power amplifier circuit 10C for connection switching by the capacitive element 401 that is required for stabilized circuit operation. The power amplification device including the power amplifier circuit 10C may thus be downsized.

In the power amplifier circuit 10, the resonant frequency of the resonant circuit 102 is the frequency of the second-order harmonic wave of the amplified signal RF1. Since the second-order harmonic wave has higher power than the power of the other harmonic waves, terminating the second-order harmonic wave by the resonant circuit 102 having a high Q value enables more reduction of an insertion loss.

Note that the embodiments described above have been provided for easier understanding of the present disclosure and is not intended to limit the interpretation of the present disclosure. The present disclosure may be changed/improved without necessarily departing from the spirit thereof and includes its equivalents. That is, any of the embodiments subjected to a designing change appropriately by those skilled in the art is included in the scope of the present disclosure as long as the changed embodiment has the feature of the present disclosure. For example, the components of each embodiment, the arrangement, the material, the condition, the shape, the size of each component are not limited to those exemplified and may be changed appropriately. It goes without necessarily saying that each embodiment is an example and the configuration described in the embodiment may be partially replaced or combined with that in a different one of the embodiments. These are included in the scope of the present disclosure, as long as these have the feature of the present disclosure.

What is claimed is:

1. A power amplifier circuit comprising:
   an amplifier configured to amplify an input signal; and
   a first resonant circuit that is connected to an output terminal of the amplifier and that is configured to attenuate a harmonic wave of an amplified signal obtained by amplifying the input signal,
   the first resonant circuit comprising:
   a first inductance circuit element connected between the amplifier and a ground,
   a first capacitive circuit element connected between the amplifier and ground, and connected in series with the first inductance circuit element,
   a second inductance circuit element connected in parallel with the first inductance circuit element,
   a first switch connected in series with the second inductance circuit element, and
   a second switch connected in parallel with the first switch, wherein sizes of surface areas of the first switch and the second switch are within 15% of each other.

2. The power amplifier circuit according to claim 1, further comprising:
   a control circuit configured to supply the first switch and the second switch with a control signal, the first switch and the second switch being configured to change between a first state and a second state based on the control signal,
   wherein the first switch and the second switch are turned ON in the first state, and the first switch and the second switch are turned OFF in the second state.

3. The power amplifier circuit according to claim 1, wherein the first switch and the second switch are connected between the second inductance circuit element and ground.

4. The power amplifier circuit according to claim 1,
   wherein the power amplifier circuit further comprises one or more second resonant circuits that are different from the first resonant circuit, the one or more second resonant circuits being connected to the output terminal of the amplifier and configured to attenuate the harmonic wave of the amplified signal,
   wherein the first resonant circuit is connected to the output terminal of the amplifier at a position electrically closer to the amplifier than a position at which any one of the one or more second resonant circuits is connected to the amplifier.

5. The power amplifier circuit according to claim 1, wherein the first capacitive circuit element is a variable capacitive circuit element having a variable capacitance value.

6. The power amplifier circuit according to claim 1,
   wherein the power amplifier circuit comprises:
   a first signal path connecting the output terminal of the amplifier and the first resonant circuit;
   a second signal path through which the amplifier receives a power supply;
   a second capacitive circuit element connected between the second signal path and ground; and
   a third switch connected to the second capacitive circuit element, the third switch being configured to turn ON when the amplifier amplifies the input signal and to turn OFF when the amplifier does not amplify the input signal,
   wherein the first switch, the second switch, and the third switch are formed on a substrate common to the first switch, the second switch, and the third switch.

7. The power amplifier circuit according to claim 1, wherein a resonant frequency of the first resonant circuit is a frequency of a second-order harmonic wave of the amplified signal.

* * * * *